United States Patent [19]

Hughes

[11] 4,225,209

[45] Sep. 30, 1980

[54] ELECTRICAL CONNECTOR RECEPTACLE

[75] Inventor: Donald W. K. Hughes, Mechanicsburg, Pa.

[73] Assignee: AMP Incorporated, Harrisburg, Pa.

[21] Appl. No.: 40,242

[22] Filed: May 18, 1979

[51] Int. Cl.³ .................... H02B 1/04; H05K 1/10
[52] U.S. Cl. .................... 339/126 R; 179/1 PC; 339/17 LC; 339/176 MP
[58] Field of Search ............ 339/17 LC, 91 R, 125 R, 339/126 R, 176 M, 176 MP, 156 R, 159 R, 98, 99 R; 179/1 PC

[56] References Cited

U.S. PATENT DOCUMENTS

| | | | |
|---|---|---|---|
| 3,444,329 | 5/1969 | Krumreich | 179/100 |
| 3,699,498 | 10/1972 | Hardesty et al. | 339/64 M |
| 3,850,497 | 11/1974 | Krumreich et al. | 339/176 M X |
| 4,040,699 | 8/1977 | Rasmussen | 339/126 R X |
| 4,070,548 | 1/1978 | Kasper | 179/1 PC |
| 4,071,696 | 1/1978 | Anderson | 179/1 PC |
| 4,146,292 | 3/1979 | Garrett | 339/176 M X |
| 4,150,863 | 4/1979 | Krafthefer et al. | 339/17 LC |

OTHER PUBLICATIONS

Amphenol Series 285 Brochure, Bunker Ramo Corp., 1978.
Shuttle Apparatus Corp. Brochure, 1978.

*Primary Examiner*—Roy Lake
*Assistant Examiner*—Eugene F. Desmond
*Attorney, Agent, or Firm*—Frederick W. Raring

[57] ABSTRACT

Electrical connector receptacle of the type used in the telecommunications industry comprises a one-piece molded housing having a plug-receiving end and a plug-receiving opening extending into the plug-receiving end. A plurality of side-by-side conductors mounted in the housing have contact spring portions which extend from an internal sidewall of the plug-receiving opening adjacent to the plug-receiving end. These conductors extend partially over an external sidewall and are bent laterally through an angle of 90 degrees so that they extend towards and past one of the endwalls of the housing. Conductor-receiving channels are provided on the external sidewall and extend to the endwall. Alternate channels are relatively deep and the remaining channels are relatively shallow so that the conductors in the channels are offset and ends of the conductors which are inserted into holes in a circuit board are offset from each other. The receptacle is intended to be mounted on a circuit board with one of its endwalls against the surface of the circuit board, an arrangement which is required under many circumstances.

10 Claims, 8 Drawing Figures

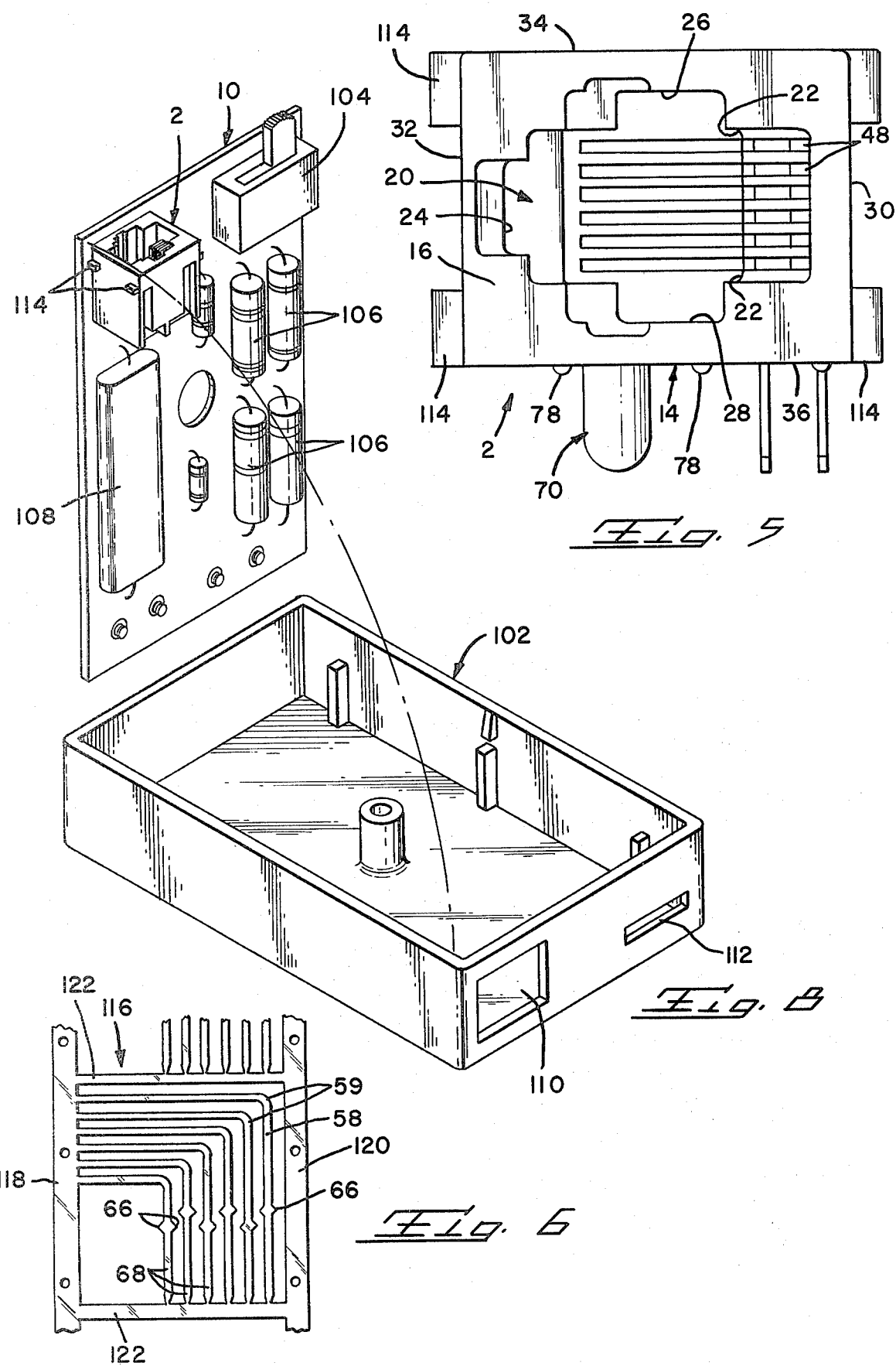

ELECTRICAL CONNECTOR RECEPTACLE

FIELD OF THE INVENTION

This invention relates to electrical connector receptacles, or jacks, as they are commonly called, of the type used in the telecommunications industry and described generally in the Federal Communications Commission documents published in the Federal Register of July 12, 1976, pages 28694–28782.

BACKGROUND OF THE INVENTION

The Federal Communications Commission documents referred to above set forth standards for electrical connector receptacles or jacks and mating connector plugs which are to be used in the telecommunications industry in order to achieve standardization of a wide variety of types of equipment used by the industry and used in conjunction with communications equipment. These documents set forth essential dimensions for the jacks and plugs but they leave room for innovation and improvement in the manufacture and performance of the plugs and jacks. A widely used type of jack or receptacle is described in detail in U.S. Pat. No. 3,850,497 and a commonly used type of connector plug is described in U.S. Pat. No. 3,954,320.

Application Ser. No. 940,536 discloses and claims a connector receptacle which satisfies all of the requirements of the Federal Communications Commission documents and which differs from the receptacle shown in U.S. Pat. No. 3,850,497 in that it has one-piece conductors mounted in the housing which have end portions that extend beyond one of the external sidewalls of the housing and which can be inserted into holes in a circuit board and connected to conductors on the circuit board.

Application Ser. No. 967,441 now U.S. Pat. No. 4,193,659 issued Feb. 18, 1980, discloses and claims an improved version of the receptacle shown in the earlier application which permits mounting the receptacle on a circuit board in a manner such that the latching arm of the plug mated with the receptacle is not immediately accessible so that removal of the plug from the receptacle is discouraged. Application Ser. No. 014,442 discloses and claims another improved receptacle which accepts a plug having a latch arm oriented in accordance with the teachings of Application Ser. No. 967,441 and having further improvements, including the provision of a continuous frame around the plug-receiving opening in the mating end or plug-receiving end of the connector housing.

Connector receptacles, as described in the above identified applications, are being favorably received by the electrical and electronics industries and are being adopted on equipment presently being designed. It would be desirable, however, to have available a connector receptacle in accordance with the Federal Communications Commission documents referred to above and which is capable of being mounted on a circuit board with one of the endwalls of the connector housing against one surface of the circuit board. The receptacles shown in the above identified applications and the other receptacles which are presently available to the industry cannot be mounted with one of the endwalls of the housing against a circuit board unless the conductors in the receptacle are connected by soldering or crimping to flexible wires which can then be led to circuit board conductors. The present invention is thus directed to the achievement of a receptacle which has the ends of its conductors extending from one of its endwalls so that it can be mounted with one endwall against a circuit board.

In accordance with the principles of the invention, the receptacle comprises an insulating housing having a plug-receiving end, a rearward end, and a plug-receiving opening extending into the plug-receiving end. The opening has opposed internal sidewalls and a plurality of side-by-side electrical conductors are mounted on the housing and extend into the plug-receiving opening from a location adjacent to one of the internal sidewalls of the opening. The intermediate, or lead, portions of the conductors extend rearwardly from a location adjacent to the plug-receiving opening partially across the external sidewall which is proximate to the one internal sidewall and these lead portions of the conductors are bent laterally through an angle of 90 degrees on the adjacent external sidewall so that their ends extend beyond one of the external endwalls of the housing. The intermediate, or lead, portions of alternative conductors are offset from the planes of the remaining conductors so that the ends of the conductors are arranged on a triangular pattern whereby they can be received in circuit board holes similarly arranged.

DESCRIPTION OF THE DRAWING

FIG. 5 is a frontal view of the connector housing.

FIG. 6 is a plan view of a section of conductor strip.

FIG. 8 is a perspective view of a housing or casing and a circuit board which is contained in the casing and illustrating the use of a receptacle in accordance with the invention.

PRACTICE OF THE INVENTION

Figure 1:
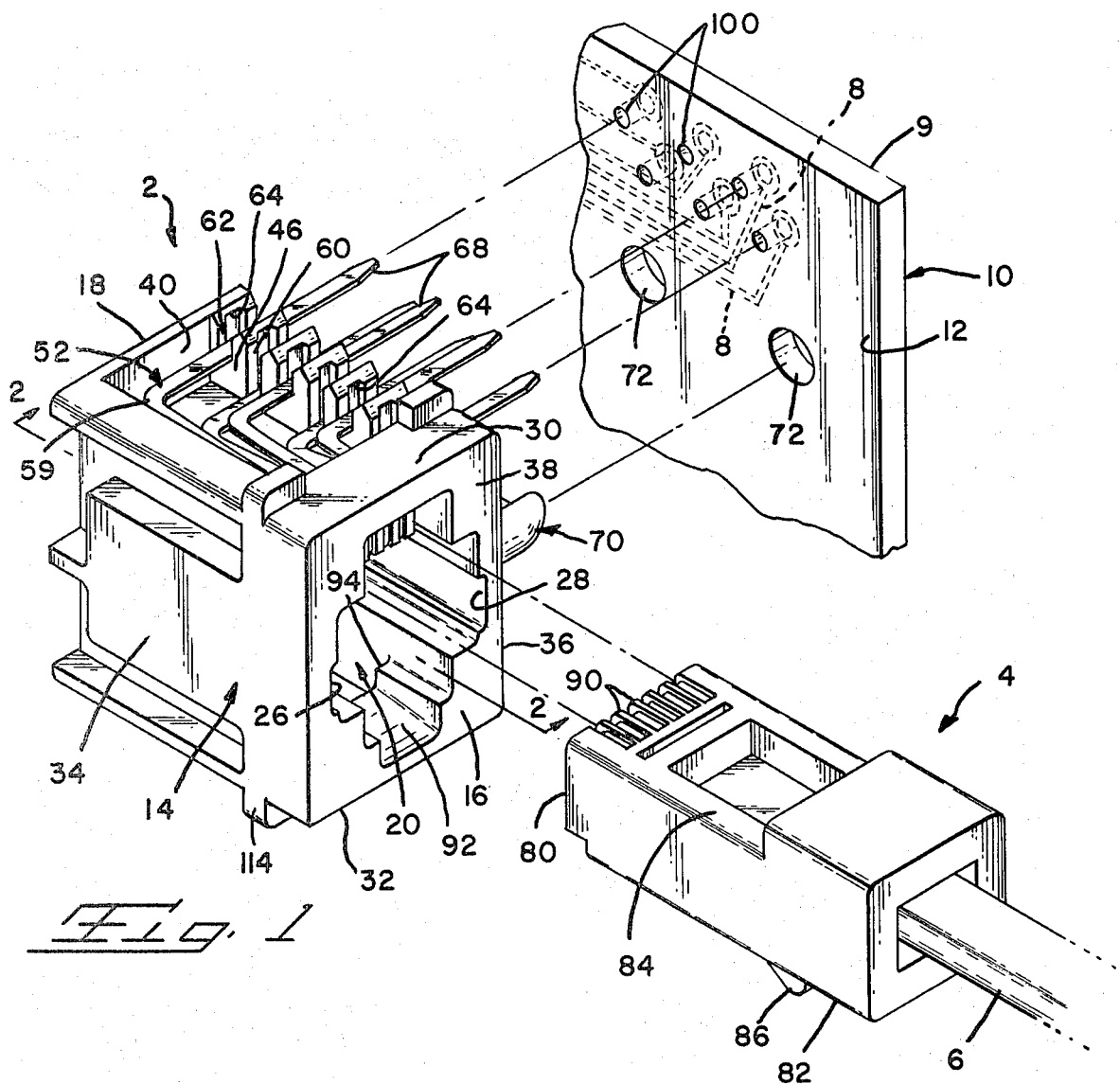
FIG. 1 is a perspective view showing a connector receptacle in accordance with the invention, exploded from one surface of a circuit board and showing a plug in alignment with the plug-receiving opening in the receptacle.
Figure 7:
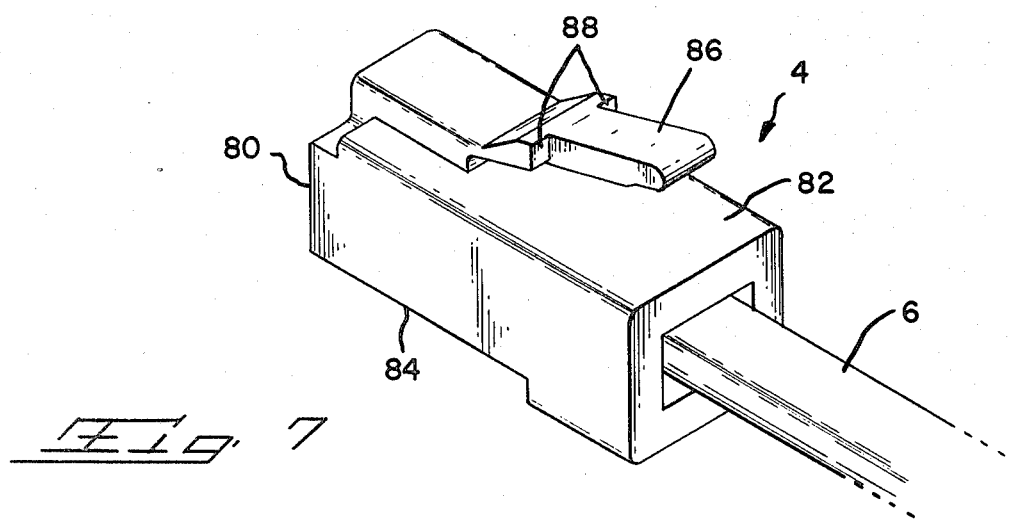
FIG. 7 is a perspective view of the connector plug.

As shown in FIG. 1, a connector receptacle 2, in accordance with the invention, serves to connect the conductors in a cable 6 having a connector plug 4 on its end, to conductors 8 on one side 9 of a circuit board 10. The connector 2 is intended to be mounted on the other side 12 of the circuit board and the conductors 8 extend to holes 100 in the circuit board which receive the ends of the conductors in the connector 2 as will be described below.

The connector 2 comprises a molded insulating housing 14 of suitable thermoplastic material, such as nylon, and has a plug-receiving end 16, a rearward end 18, and a plug-receiving opening 20 extending inwardly from the plug-receiving end 16. Opening 20, as shown in FIG. 5, has opposed internal sidewalls 22, 24, and opposed internal endwalls 26, 28. The housings has oppositely directed external sidewalls 30, 32 which are proximate to the internal sidewalls 22, 24 respectively, and oppositely directed external endwalls 34, 36 which are proximate to the opposed internal endwalls 26, 28. This terminology regarding the internal and external endwalls and sidewalls is the same as the terminology employed in the above identified application Ser. No. 014,442.

Figures 2, 3, 4:
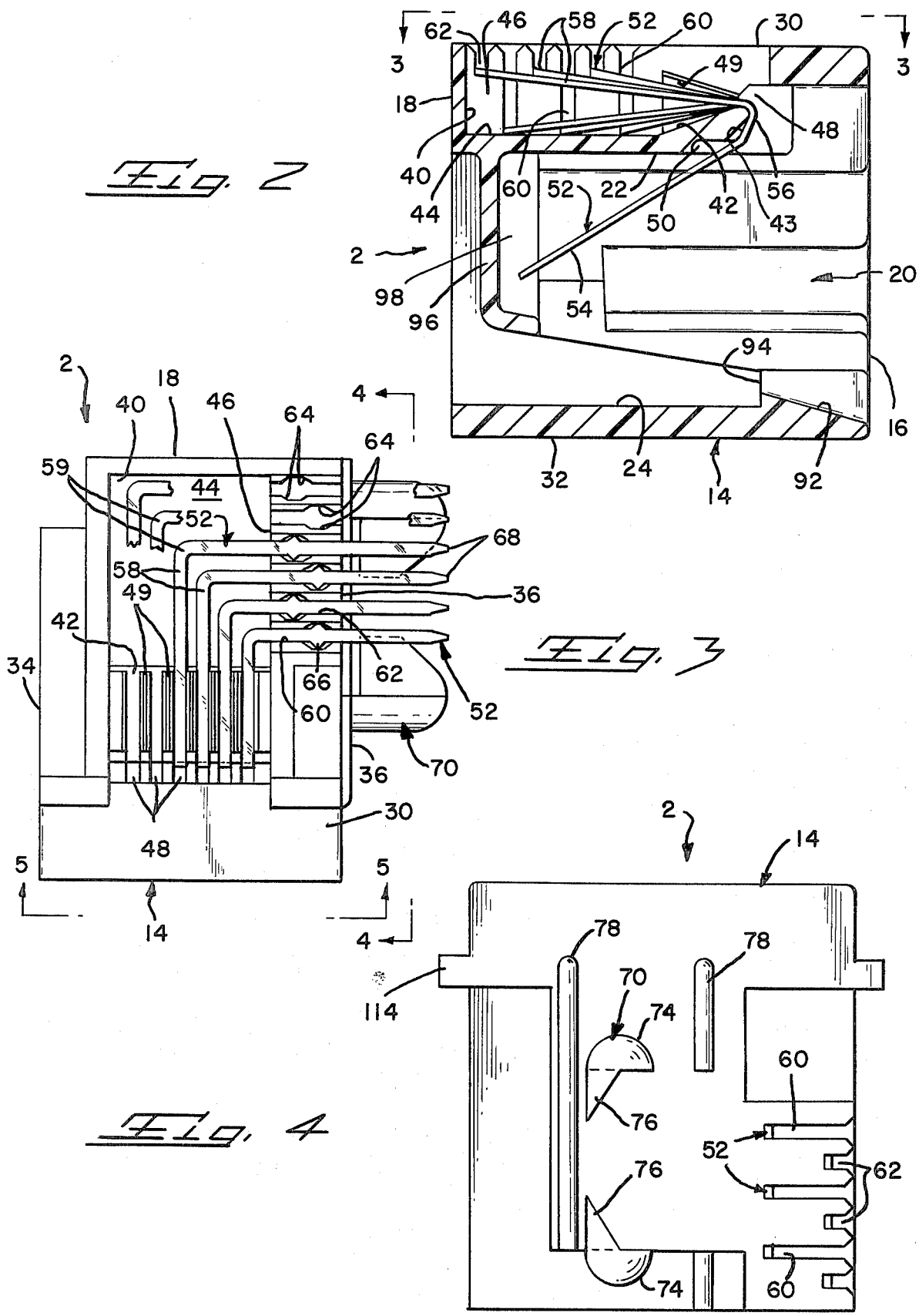
FIG. 2 is a cross-sectional view of the receptacle taken along the lines 2—2 of FIG. 1.
FIG. 3 is a view of one of the external sidewalls of the connector housing looking in the direction of the arrows 3—3 in FIG. 2.
FIG. 4 is a plan view, in the direction of the arrows 4—4 of FIG. 3, of the endwall which is mounted against the surface of the circuit board.

The plug-receiving opening 20 is surrounded by a continuous frame at the plug-receiving end 16, as shown at 38, and the external sidewall 30 which is proximate to the internal sidewall 22 has a recess 40 or depression therein as best shown in FIG. 2. This recess extends from a location spaced from the plug-receiving end 16 rearwardly of the housing substantially to the rearward end 18 and one side 46 of the recess extends parallel to, but is spaced from, the external endwall 36 as shown in FIG. 3. The floor of the recess slopes downwardly as shown in 42 from the right hand end of the recess, as shown in FIG. 2, to a flat or plane floor portion 44 which extends to the rearward end of the recess.

A plurality, equal in number to the number of conductors 52, of apertures 48 are provided in the floor of the recess 40 at the right hand end thereof, these apertures being arranged in side-by-side relationship in a row which extends between the external endwalls 34, 36. The apertures extend to the plug-receiving opening 20 and the internal sidewall 22 is recessed as shown at 50 adjacent to each aperture. Also, a curved surface is provided as shown at 43, extending from each aperture to the recess 50 to permit flexing of the spring portions of the conductors. Spaced-apart barriers 49 are provided on the inclined portion 42 of the floor or recess 40 between adjacent apertures 48. These barriers 49 separate the portions of the conductors which extend from the apertures, as will be described below also.

The conductors which are generally indicated at 52 have contact spring portions 54 which extend from the apertures 48 diagonally towards the rearward end of the housing and away from the internal sidewall 22. The conductors are reversely bent, as shown at 56, in the apertures and have lead portions 58 which extend rearwardly of the housing and into the recess 40 in the external sidewall 30. The intermediate portions of the conductors are bent laterally as shown at 59, through an angle of 90 degrees, these bends being offset from each other from one conductors to another so that the conductors extend laterally in spaced-apart relationship towards and past the endwall 36. The external sidewall 30 is provided with spaced-apart channels 60, 62 which extend from the one side 46 of the recess 40 to the endwall 36, alternate channels 60 being relatively deep, as shown best in FIG. 2, while the remaining channels 62 are relatively shallow. Alternate conductors are inclined upwardly from the apertures 48 and extend to the shallow channels 62 while the remaining conductors are inclined downwardly toward the floor 44 of the recess and extend through the deep channels 60. The ends 68 of the conductors which extend beyond endwall 36 are thus offset from each other and can be inserted into offset holes 100 shown in FIG. 1.

The sidewalls of the channels 60, 62 are provided with depressions, or recesses 64, as shown in FIG. 3, which receive barbs 66 extending laterally from the side edges of the conductors thereby to maintain the conductors in the channels. The intermediate portions of the conductors which extend from the apertures 48 to the channels 60 and 62 are thus held rigidly by these barbs in the channels and by virtue of the fact that the conductors are held in the individual apertures 48.

Integral mounting feet 70 extend from the endwall 36 of the housing and are dimensioned to be received in spaced-apart holes 72 in the circuit board. The mounting feet can be of the type described in Application Ser. No. 022,741 and in general comprise semi-cylindrical portions 74 from which a fin 76 extends, the fin being tapered towards the outer free end of the foot so that the fin can be collapsed as the feet enter the holes 72. Additionally, standoff ribs 78 are provided on the external endwall 36 so that the surface of this endwall will be spaced from the surface 12 of the circuit board when the ends 68 of the conductors are soldered to the conductors 8 on the circuit board. It is desirable to provide such standoff means in order to prevent the flow of solder or flux to the connector. Finally, the housing has stop ears 114 extending from the endwalls which bear against the surface of a panel in which the connector is mounted as will be described below.

The connector plug 4 is generally rectangular having a leading end 80 and side surfaces 82, 84 extending rearwardly from the leading end. A latch arm 86 extends from the surface 82 adjacent to the leading end and has rearwardly facing shoulders 88 which engage complementary shoulders in the receptacle. The conductors in the cable 6 are contacted adjacent to the leading end 80 by contact members 90 which extend to the side surface 84 of the plug and which engage the contact spring portions 54 of the conductors 52 in the receptacle.

As shown best in FIG. 2, an inclined ramp 92 is provided on the internal sidewall 24 of the plug-receiving opening and provides clearance for the latch arm 86 when the plug is inserted. Shoulders 94 on each side of this ramp engage the shoulders 88 of the latch arm when the plug is fully inserted. The housing disclosed is also provided with a back wall 96 which extends downwardly as viewed in FIG. 2 from the internal sidewall 22 and spaced-apart barriers extend towards the mating end from this back wall to define stalls 98 which receive the free ends of the contact springs 54. This arrangement separates the free ends of the contact springs and prevents accidental shorting and additionally, constitutes a safety factor in the event that a small child should attempt to insert a finger into the opening 20.

The individual conductors are advantageously stamped and formed as frames comprising groups of conductors 116 in a continuous strip. The strip has parallel spaced-apart carrier strips 118, 120 and transversely extending support strips 122 with a group of conductors for a single housing between each pair of adjacent support strips 122. As shown in FIG. 6, the ends of the spring portions of the conductors are integral with the carrier strip 118 and the ends of the portions 58 of the conductors are integral with a transverse support strip 122. The strip metal from which the conductors shown in FIG. 6 are stamped may be selectively plated with gold prior to stamping so that the contact spring portion of the conductors will have a gold plating thereon. The strip itself may be of brass or other conductive metal having good spring characteristics. The conductors can be flat or formed arcuately, as described in the above identified Application Ser. No. 967,441 and are severed from the support strip 122 and carrier strip 118 at the time of assembly of the conductors to the housing. In general, the assembly methods can be in accordance with the principles described in Application Ser. No. 014,442.

As an alternative, wire conductors rather than stamped conductors can be used particularly if the apertures and the channels 60, 62 are made small enough to grip wires, however, stamped conductors offer distinct advantages as regards assembly and electrical contact.

Connector receptacles, in accordance with the invention, are mounted on circuit boards simply aligning the connector with the circuit board openings 72 as shown in FIG. 1, and moving the connector housing against the surface of the circuit board. The locking legs 70 will move into the openings 72 and the end portions 68 of the conductors will move into the openings 100. The legs 70 will hold the housing on the circuit board and the ends of the conductors 68 can then be soldered to the conductors 8 on the circuit board by passing the circuit board through a wave soldering apparatus.

Connectors in accordance with the invention are particularly useful when it is desired to mount circuit boards in side-by-side spaced-apart relationship and in a vertical orientation. The circuit boards can be placed relatively closely together since the smaller dimension of a connector housing is usually the dimension between the endwalls 34, 36 rather than the dimension between the external sidewalls 30, 32. Furthermore, when connectors in accordance with the invention are used, the plug-receiving opening 20 will be oriented conveniently for insertion of a connector plug 4, that is, with the latch arm 86 up or down, depending upon which side of the circuit board the housing is mounted on.

FIG. 8 illustrates the use of a connector 2 in accordance with the invention on a circuit board 10 which is contained in the rectangular housing 102. Housings of the type shown in FIG. 8 may be provided with a cover or may be mounted with the open side against a panel. In any event, this type of housing for a circuit board is commonly used on some computer equipment and requires a switch 104, and circuit elements 106, 108 on the circuit board. The purpose is to be able to connect conductors in a cable 6 to the circuit board and the connector receptacle 2 in FIG. 8 serves to provide these connections. When the circuit board 10 is placed in the housing 102, the switch arm will extend through a window 112 and the plug-receiving opening of the receptacle 2 will be in alignment with a window 110. It will be apparent that the height or thickness, of the casing 102 can be kept to a bare minimum with connectors of the type shown on the circuit board.

It should be mentioned that circuit boards and casings of the type shown in FIG. 8 are now commonly used with commercially available connector receptacles. The connections between the receptacle conductors and the circuit board are achieved in these known devices by crimping wires onto the conductors in the receptacle and soldering the ends of these wires to the conductors on the circuit board 10. The housing 2 is not mounted on the circuit board but is rather mounted in the casing in alignment with the window 110, separately from the circuit board.

I claim:

1. An electrical connector receptacle of the type comprising an insulating housing having a plug-receiving end and a rearward end, a plug-receiving opening extending into said plug-receiving end, said opening having opposed internal sidewalls and opposed internal endwalls, said housing having oppositely directed external sidewalls and oppositely directed external endwalls, a plurality of electrical conductors in side-by-side spaced-apart relationship, each of said conductors comprising a contact spring portion extending from one of said internal sidewalls at a location adjacent to said plug-receiving end diagonally into said plug-receiving opening and towards the opposite internal sidewall, and each conductor having a lead portion extending from said plug-receiving end towards said rearward end and externally of said housing, said plug-receiving opening being dimensioned to receive a connector plug having spaced-apart contact members therein which engage said contact spring portions of said conductors, said connector receptacle being characterized in that:
   said lead portions of said conductors extend from said plug-receiving end partially across the external sidewall which is adjacent to said one internal sidewall, said lead portions being bent laterally at locations between said ends of said housing and extending towards and beyond one of said endwalls, said conductors having end portions projecting beyond said one endwall which are adapted to be mounted in a circuit board.

2. A connector receptacle as set forth in claim 1, said housing having integral mounting means extending from said one endwall for mounting said housing on a circuit board with said one endwall substantially against the surface of said circuit board and with said end portions of said conductors extending into openings in said circuit board.

3. An electrical connector receptacle as set forth in claim 1, said adjacent external sidewall having an opening means therein spaced from said plug-receiving end, said conductors extending through said opening means to said adjacent external sidewall.

4. An electrical connector receptacle as set forth in claim 3, said adjacent external sidewall having a recess therein which is between said opening means and said rearward end of said housing, said recess having one side which is proximate to said one external endwall, a plurality of side-by-side channels in said adjacent external sidewall extending from said recess to said one external endwall, said conductors extending from said recess laterally through said channels.

5. An electrical connector as set forth in claim 4, alternate ones of said channels being relatively deep and the remaining channels being shallow whereby said end portions of said conductors are offset from each other.

6. An electrical connector as set forth in claim 4, opening means comprising a plurality of apertures extending through said adjacent external sidewall to said plug-receiving opening, said apertures being arranged in a row extending between said endwalls and adjacent to said plug-receiving end.

7. An electrical connector as set forth in claim 6, said adjacent external sidewall having a plurality of conductor-separating barrier walls thereon, said barrier walls extending from locations adjacent to said apertures and between adjacent apertures and extending partially towards said rearward end of said housing.

8. An electrical connector receptacle of the type comprising an insulating housing having a plug-receiving end and a rearward end, a plug-receiving opening extending into said plug-receiving end, said opening having opposed internal sidewalls and opposed internal endwalls, said housing having oppositely directed external sidewalls and oppositely directed external endwalls, a plurality of electrical conductors in side-by-side spaced-apart relationship, each of said conductors comprising a contact spring portion extending from one of said internal sidewalls at a location adjacent to said plug-receiving end diagonally into said plug-receiving opening and towards the opposite internal sidewall, and each conductor having a lead portion extending from said plug-receiving end towards said rearward end and externally of said housing, said plug-receiving opening being dimensioned to receive a connector plug having spaced-apart contact members therein which engage said contact spring portions of said conductors, said connector receptacle being characterized in that:

said housing has a plurality, equal to the number of said conductors, of apertures extending through the one external sidewall which is adjacent to said one internal sidewall, said apertures extending to said plug-receiving opening, said apertures being arranged in a row extending between said endwalls and being adjacent to said plug-receiving end of said housing, said adjacent external sidewall has a recess therein which is between said row of apertures and said rearward end of said housing, said recess having one side which is proximate to, and extends parallel to, one of said external endwalls, a plurality of side-by-side channels in said adjacent external sidewall extending from said one side of said recess to said one endwall, alternate channels being relatively deep and the remaining channels being relatively shallow, said lead portions of said conductors extending through said apertures, into said recess, and partially towards said rearward end of said housing, said lead portions being bent laterally in said recess and extending through said channels and beyond said one endwall, said conductors having end portions projecting beyond said one endwall which are offset from each other and which are adapted to be mounted in a circuit board.

9. A connector receptacle as set forth in claim 8, said conductors being stamped sheet metal conductors.

10. A connector receptacle as set forth in claim 9, said housing having a plurality of conductor separating barrier walls on said one external sidewall and in said recess, said barrier walls extending from locations adjacent to said apertures partially towards said rearward end.

* * * * *